United States Patent
Tai (10) Patent No.: US 9,747,405 B2
(45) Date of Patent: Aug. 29, 2017

(54) BUFFER CHAIN MANAGEMENT FOR ALLEVIATING ROUTING CONGESTION

(71) Applicant: Synopsys, Inc., Mountain View, CA (US)

(72) Inventor: Philip H. Tai, Cupertino, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/406,375

(22) Filed: Jan. 13, 2017

(65) Prior Publication Data

US 2017/0124244 A1    May 4, 2017

Related U.S. Application Data

(62) Division of application No. 14/510,334, filed on Oct. 9, 2014, now Pat. No. 9,613,176.

(51) Int. Cl.
G06F 17/50    (2006.01)

(52) U.S. Cl.
CPC ...... *G06F 17/5072* (2013.01); *G06F 17/5081* (2013.01)

(58) Field of Classification Search
CPC .................................................. G06F 17/5081
USPC .......................................................... 716/106
See application file for complete search history.

(56) References Cited

U.S. PATENT DOCUMENTS

| | | | |
|---|---|---|---|
| 6,480,991 B1 * | 11/2002 | Cho | G06F 17/5072 716/122 |
| 2002/0184607 A1 | 12/2002 | Alpert | |
| 2004/0123261 A1 | 6/2004 | Alpert | |
| 2005/0125758 A1 | 6/2005 | Lembach | |
| 2005/0138578 A1 | 6/2005 | Alpert | |
| 2007/0094631 A1 * | 4/2007 | Galatenko | G06F 17/5045 716/104 |
| 2007/0271543 A1 | 11/2007 | Alpert | |
| 2009/0100397 A1 | 4/2009 | Palumbo | |
| 2010/0049481 A1 | 2/2010 | Walker | |
| 2011/0161901 A1 | 6/2011 | Berry | |
| 2016/0012172 A1 | 1/2016 | Folberth | |

* cited by examiner

*Primary Examiner* — Suresh Memula
(74) *Attorney, Agent, or Firm* — Park, Vaughan, Fleming & Dowler LLP; Laxman Sahasrabuddhe (57) ABSTRACT

Systems and techniques for alleviating congestion are described. A set of buffer chains that pass through a congested region of the circuit design can be identified. Next, the set of the buffer chains can be removed from the circuit design. A placement blockage in the circuit design can then be created that covers at least a portion of the congested region. Next, the buffer chains that were removed can be reconstructed in the circuit design in the presence of the placement blockage, thereby alleviating congestion. Once the buffer chains have been reconstructed, the placement blockage can be removed from the circuit design. In some embodiments, congestion can be alleviated by spreading out buffer chains based on spreading out center of mass lines corresponding to the buffer chains.

20 Claims, 7 Drawing Sheets

BUFFER CHAIN MANAGEMENT FOR ALLEVIATING ROUTING CONGESTION

RELATED APPLICATION

This application is a divisional of, and claims priority to, U.S. application Ser. No. 14/510,334, filed on 9 Oct. 2014, having attorney docket number SNPS-2419US01, the contents of which are herein incorporated by reference in their entirety for all purposes.

BACKGROUND

Technical Field

This disclosure relates to electronic design automation (EDA). More specifically, this disclosure relates to buffer chain management for alleviating routing congestion.

Related Art

Advances in process technology and an almost unlimited appetite for consumer electronics have fueled a rapid increase in the size and complexity of integrated circuit (IC) designs. The performance of EDA tools is very important because it reduces the time to market for IC designs.

Placement and routing are two important processes that are performed in an EDA flow. Placement involves determining locations for circuit objects (e.g., cells instances, macros, etc.) in the circuit design. Routing involves determining routes for metal wires which electrically connect circuit objects to produce circuits that perform desired functions. Performing placement and routing on large circuit designs using conventional techniques and can take a long time and/or lead to poor quality results. Hence, it is desirable to improve the performance and quality of results of placement and routing, especially for large circuit designs.

SUMMARY

Some embodiments described in this disclosure provide systems and techniques for alleviating congestion. According to one definition, congestion occurs in a region of the circuit design when the amount of routing resources in the region is less than a minimum amount of routing resources that should be available in the region, wherein the minimum amount of routing resources is based on the routing demand in the region.

Specifically, some embodiments can begin by identifying a set of buffer chains that pass through a congested region of the circuit design. Next, the embodiments can remove the set of the buffer chains from the circuit design. The embodiments can then create a placement blockage in the circuit design that covers at least a portion of the congested region. Next, the embodiments can reconstruct the set of buffer chains in the circuit design in the presence of the placement blockage. The embodiments can then remove the placement blockage from the circuit design.

In some embodiments, buffer chains that pass through a region of a circuit design can be identified as follows. First, the embodiments can identify a set of buffer chains such that at least a portion of each buffer chain in the set of buffer chains is located in the region. Next, the embodiments can determine a buffer source and a set of buffer sinks for each buffer chain in the set of buffer chains. The embodiments can then identify buffer chains in the set of buffer chains whose buffer source and the set of buffer sinks are located outside the region.

In some embodiments, congestion due to buffer chains can be alleviated by spreading out buffer chains that pass through a region. Specifically, the embodiments can determine a center of mass line for each buffer chain in the set of buffer chains that passes through the region. The embodiments can then move one or more center of mass lines to a new location. Next, for each center of mass line that was moved, the embodiments can move the corresponding buffer chain based on the new location of the center of mass line.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an EDA Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that the circuit designers want to implement. These tools also enable circuit designers to perform what-if planning to refine functionality, check costs, etc. During logic design and functional verification, the HDL (hardware description language), e.g., Verilog, code can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled.

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Routing Congestion

Figure 1:
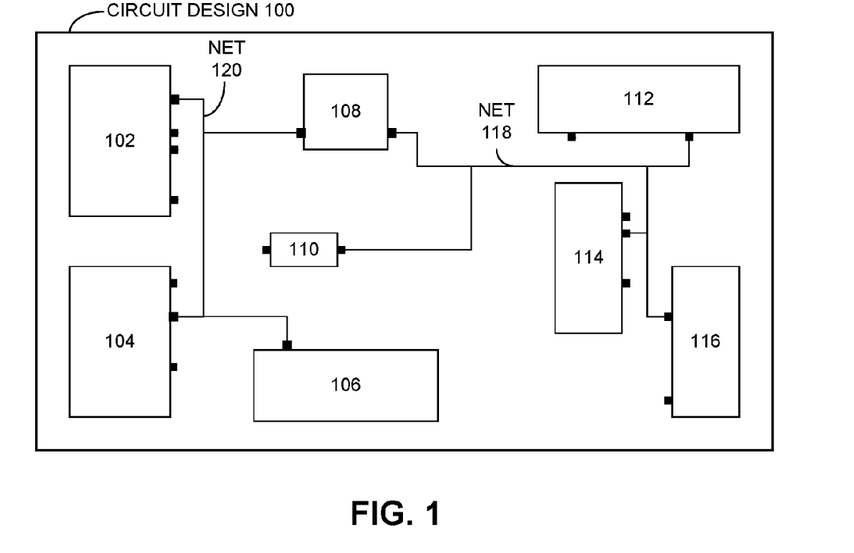
FIG. 1 illustrates an example of a routing problem in accordance with some embodiments described in this disclosure.

Large-scale IC chips are typically routed using routing software, which is typically referred to as a "routing system" or "router." FIG. 1 illustrates an example of a routing problem in accordance with some embodiments described in this disclosure. Circuit design 100 includes a set of blocks (e.g., blocks 102, 104, 108, 110, 112, 114, and 116) that may represent circuit objects at any level in the design hierarchy. For example, the blocks can be cells, macros, or any other circuit object at any level of hierarchy. The routing process can be performed at different levels in the design hierarchy. However, the routing process typically operates at only one level at any given time. A block of the circuit design can have one or more pins or terminals that are assigned to nets. The task for the routing system is to route wires in the circuit design so that the pins or terminals that belong to the same net are electrically connected together. For example, the routing system may create net 120 to electrically connect pins in blocks 102, 104, 106, and 108, and net 118 to electrically connect pins in blocks 108, 110, 112, 114, and 116.

The routing process or system can take multiple inputs, which can include, but are not limited to: (a) a placed netlist which provides placement information for a set of cells, (b) a description of the technology (i.e., the number of metal layers, and the characteristics of the layers), (c) an assignment of pins/terminals to nets, (d) a set of design rules that must be satisfied by the routing solution, and (e) timing information, e.g., timing criticality. The output of the routing system includes, but is not limited to, a netlist which electrically connects all pins/terminals that belong to each net, and a routing summary which can include wire length, via count, and unresolved DRCs.

A routing process typically has three stages: global routing, track assignment, and detailed routing. In the global routing stage the system does not create detailed routing shapes for the wires. Instead, the system determines the topologies of multi-pin nets and areas that the nets should go through to minimize one or more routing metrics. In the track assignment stage the system refines the global routing plan by assigning wires to tracks. Note that, although the track assignment may generate detailed routes for the wires, the routing solution at this stage may not satisfy all of the design rules because this stage typically uses a simpler routing model than the next stage, namely, detailed routing. Finally, in the detailed routing stage the system creates the exact path and the specific shapes for each wire. Note that all of the design rules are typically used in this stage to ensure that the routed wires do not violate any of the design rules.

Routing is typically performed at multiple steps in the circuit design flow. For example, during floorplanning, global routing can be performed to check if a given floorplan is expected to cause routing congestion during the actual routing step in the circuit design flow (the global routing used during floorplanning can be approximate, i.e., it may not be as accurate as the global routing step that is used during the actual routing step). The circuit blocks can be abstracted out to hide unnecessary details, thereby speeding up the routing process. Specifically, the floorplanning tool can represent macros and standard cells as blocks. Each macro and standard cell typically has multiple pins which need to be electrically connected together based on their net assignments. Some embodiments described herein are performed during floorplanning.

According to one definition, routing congestion occurs in a region of the circuit design when the routing resources (e.g., number of wire tracks) are insufficient to satisfy the routing demand for the region (e.g., the number of wires that need to be routed through the region). For example, the global routing solution (i.e., the output of the global routing process) can be used to determine whether or not routing congestion is expected to occur when the pins of the circuit blocks are electrically connected using wires. Other techniques can also be used to determine congestion, e.g., placement based statistical models, virtual routing based techniques, etc. Embodiments described in this disclosure are agnostic to the type of technique used for identifying routing congestion.

Figure 2:
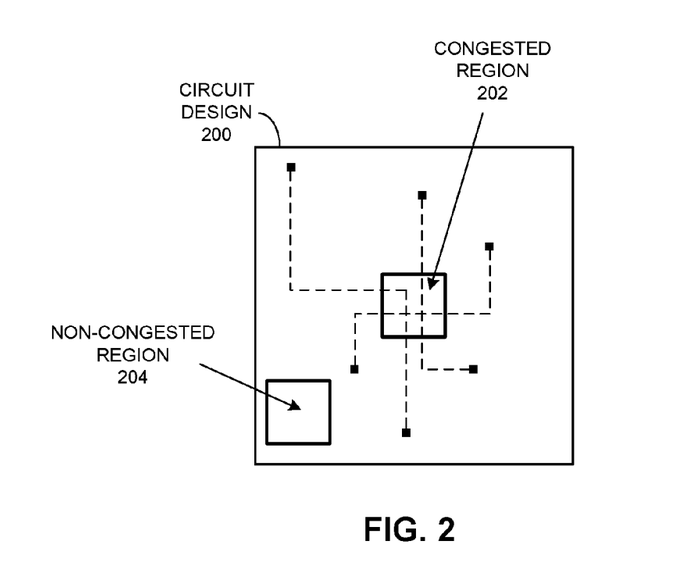
FIG. 2 illustrates routing congestion in a circuit design in accordance with some embodiments described in this disclosure.

FIG. 2 illustrates routing congestion in a circuit design in accordance with some embodiments described in this disclosure. The dashed lines in FIG. 2 represent routes of nets in circuit design 200. A net may include one or more buffer chains, but these buffer chains have not been shown in FIG. 2 for the sake of clarity. The routing system may determine that region 202 in circuit design 200 is congested because the amount of routing resources that are expected to be used in this region exceeds a threshold value. For example, the amount of routing resources used in this region may exceed a given fraction (e.g., 80%) of the amount of routing resources that are available in this region. In contrast, no routing resources are being used in non-congested region 204, and so this region is not congested.

Figure 3:
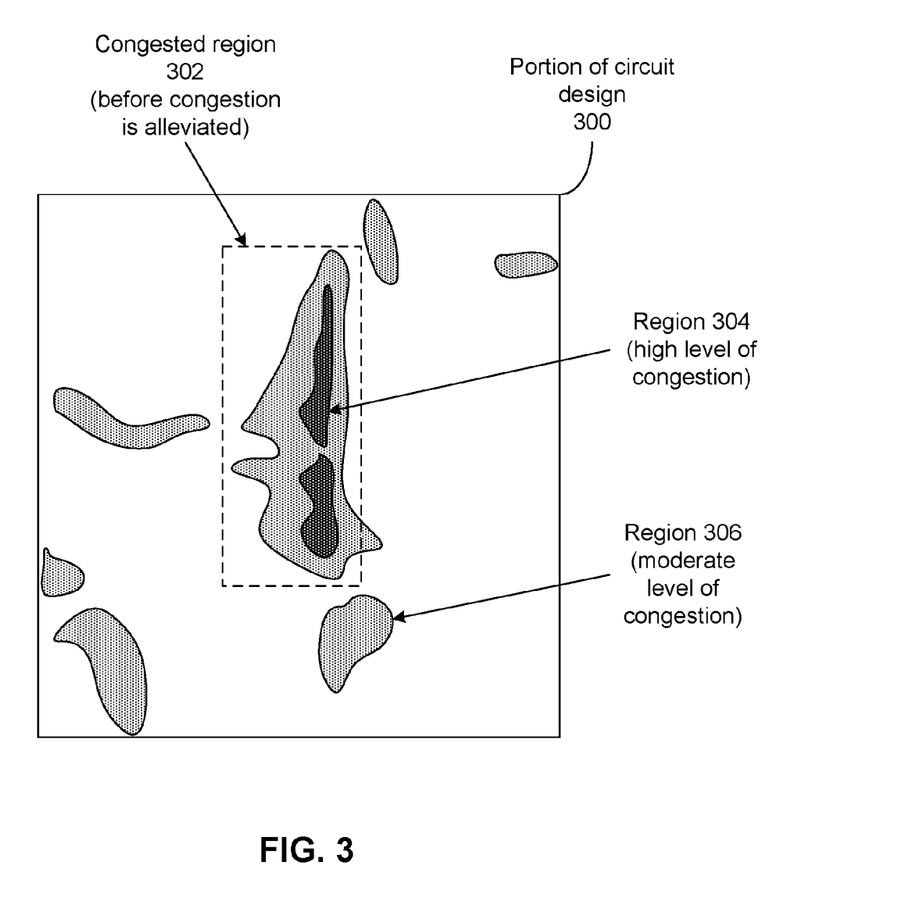
FIG. 3 illustrates how a visual representation of congestion in the circuit design can be displayed through a graphical user interface (GUI) in accordance with some embodiments described in this disclosure.

FIG. 3 illustrates how a visual representation of congestion in the circuit design can be displayed through a GUI in accordance with some embodiments described in this disclosure. In FIG. 3, different shades represent different levels of congestion. Specifically, a darker shade represents higher level of congestion. For example, region 304 has a high level of congestion, region 306 has a moderate level of congestion, and the unshaded regions have little or no congestion. As shown in FIG. 3, congested region 302 in portion of circuit design 300 includes a significant amount of dark shading.

In some embodiments, a heat map can be used to represent congestion, i.e., different colors in the visible spectrum can be used to represent different levels of congestion. In these embodiments, blue can represent a low level of congestion and red can represent a high level of congestion, and the other colors in the visible spectrum can represent gradually increasing levels of congestion as we move from the blue end of the visible spectrum to the red end of the visible spectrum. The black regions in a heat map can represent regions that have zero or insignificant amounts of congestion.

Once a routing congestion region has been identified in the circuit design, the user can use the floorplanning tool to alleviate routing congestion. Conventional techniques for alleviating routing congestion often fail to produce good quality of results. In contrast to such conventional techniques, embodiments described in the instant application can very quickly eliminate or substantially reduce routing congestion. Some embodiments of systems and techniques for analyzing circuit designs, and alleviating routing congestion are described below.

Process for Analyzing Buffer Chains

According to one definition, a buffer is an active circuit object that can help carry a signal in the circuit design from an output pin of a first cell to an input pin of a second cell. For example, the term "buffer" can refer to an inverter, a pair of inverters, or any other circuit element that can help carry a signal in the circuit design from an output pin of a first cell to an input pin of a second cell. Note that a buffer is not added to the circuit design to perform a logical function. According to one definition, a buffer chain is a sequence of buffers, wherein an output of each buffer in the sequence of buffers is electrically connected to an input of the next buffer in the sequence of buffers. The input of the first buffer in the buffer chain is electrically connected to the source of the signal, e.g., a data output pin of a gate, a clock source, etc. The output of the last buffer in the buffer chain is electrically connected to the sink of the signal, e.g., a data input pin of a gate, a clock input pin of a sequential circuit element, etc.

For example, suppose we need to provide the output of a first gate as an input to a second gate. Furthermore, let us assume that the first gate is not large enough to directly drive the input of the second gate (e.g., because if the first gate directly drives the second gate then the path will violate a timing constraint). In this situation, a buffer chain (that includes one or more buffers) can be inserted in the path from the first gate to the second gate, i.e., the first gate can drive the first buffer in the buffer chain and the last buffer in the buffer chain can drive the second gate. In this example, the output of the first gate is a source of the buffer chain and the input of the second gate is the sink of the buffer chain. Note that a buffer chain can have multiple sinks, e.g., if the first gate is supposed to drive the second gate and a third gate, then the above-described buffer chain can be used to drive both the second gate and the third gate.

Figure 4:
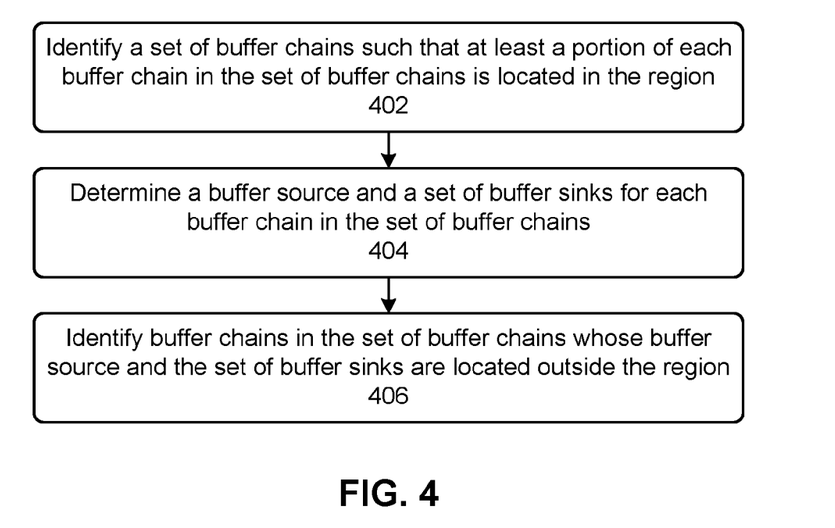
FIG. 4 illustrates a process for identifying buffer chains that pass through a region of a circuit design in accordance with some embodiments described in this disclosure.

FIG. 4 illustrates a process for identifying buffer chains that pass through a region of a circuit design in accordance with some embodiments described in this disclosure. According to one definition, a buffer chain passes through a region if all sources and sinks of the buffer chain are located outside the region. The process can begin with identifying a set of buffer chains such that at least a portion of each buffer chain in the set of buffer chains is located in the region (operation 402). For example, the process can first identify a set of buffers that are located in the region. Specifically, a database that stores the circuit design can be queried based on identifiers associated with buffer cells, and the database can return all buffer cells that are located in the given region. Next, the process can identify the set of buffer chains based on the set of buffers.

Next, the process can determine a buffer source and a set of buffer sinks for each buffer chain in the set of buffer chains (operation 404). The process can then identify buffer chains in the set of buffer chains whose buffer source and the set of buffer sinks are located outside the region (operation 406).

In some embodiments, it may not be desirable to reroute buffer chains whose timing slacks are critical. In these embodiments, the set of buffer chains does not include buffer chains whose timing slack is less than a threshold timing slack value. Specifically, the process can determine timing slacks for the buffer chains, and filter out the buffer chains whose timing slack is less than a pre-determined timing threshold (e.g., a user-specified timing threshold).

Process for Alleviating Routing Congestion by Using a Placement Blockage

Figure 5:
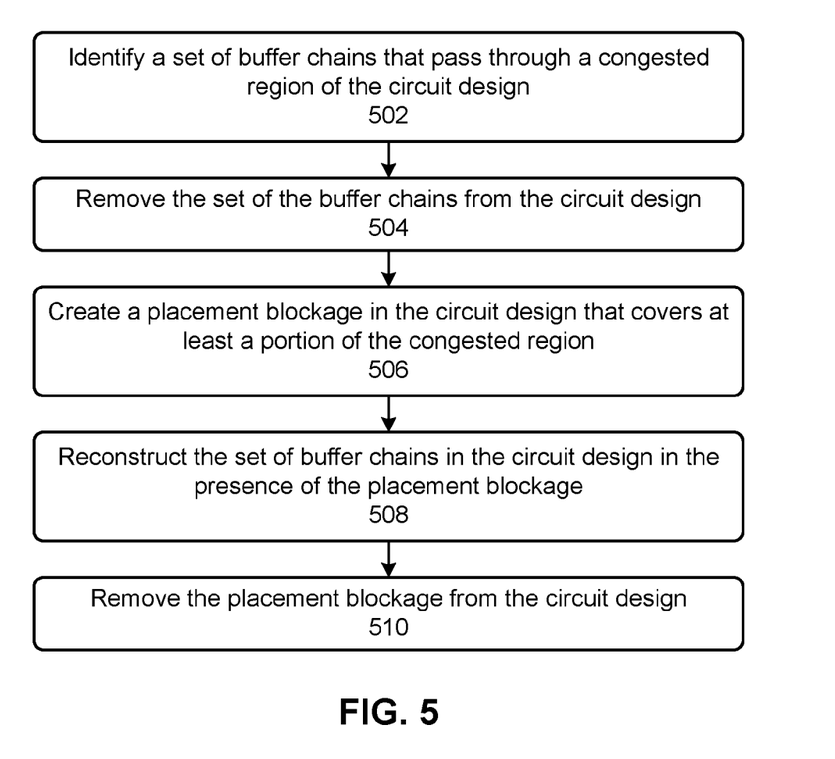
FIG. 5 illustrates a process for alleviating routing congestion in accordance with some embodiments described in this disclosure.

FIG. 5 illustrates a process for alleviating routing congestion in accordance with some embodiments described in this disclosure. The process can begin with identifying a set of buffer chains that pass through a congested region of the circuit design (operation 502). For example, the process illustrated in FIG. 4 can be used to identify the set of buffer chains. In some embodiments, the EDA tool may present a visual representation of congestion in the circuit design through a GUI. Next, the EDA tool may receive a user-selected contour of the congested region through the GUI. In some embodiments, certain buffer chains may be flagged as being fixed, e.g., a user may indicate that certain buffer chains are fixed buffer chains. In such cases, the EDA tool may filter out such buffer chains so that the set of buffer chains does not include buffer chains whose placement has been fixed.

Next, the process can remove the set of buffer chains from the circuit design (operation 504). Removing the set of buffer chains includes removing the buffers and removing any routing information associated with the buffers from the circuit design. The process can then create a placement blockage in the circuit design that covers at least a portion of the congested region (operation 506). A placement blockage is a region in the circuit design where a placement engine is not allowed to place cells. Note that the placement blockage may include cells that were in the set of buffer chains that was removed in operation 504. However, the next time the placement engine is executed in the presence of the placement blockage, the placement engine will not place any cells in the placement blockage. In some embodiments, the EDA tool may present a visual representation of congestion in the circuit design through a GUI. Next, the EDA tool may receive a user-selected contour of the congested region through the GUI. In some embodiments, the EDA tool may receive a user-selected contour of the placement blockage through the GUI.

Next, the process can reconstruct the set of buffer chains in the circuit design in the presence of the placement blockage (operation 508). Specifically, reconstructing the set of buffer chains can comprise determining (1) the number of buffers in each buffer chain (e.g., based on the driving cell, the set of sink cells, and the distances between the driving cell and the set of sink cells), (2) a size for each buffer in each buffer chain, and (3) a location for each buffer in each buffer chain. The placement engine will not place the reconstructed buffer chains in the placement blockage, thereby alleviating congestion. Once the buffer chains have been reconstructed in the presence of the placement blockage, the process can then remove the placement blockage from the circuit design (operation 510).

When a buffer chain is reconstructed, it may increase the delay of the buffer chain, thereby creating new timing violations in the circuit design. Therefore, in some embodiments, the system (e.g., a computer executing an EDA tool) can determine timing slacks for each buffer chain that is passing through the congested region (i.e., before performing operation 504). Next, the buffer chains whose timing slack is less than a threshold timing slack value (i.e., the buffer chains that may create new timing violations if they are reconstructed in the presence of the placement blockage) can be removed from the set of buffer chains that are being considered for being reconstructed to alleviate congestion. In other words, the set of buffer chains that are removed from the circuit design in operation 504 may not include buffer chains whose timing slack is less than a given threshold value.

Figure 6:
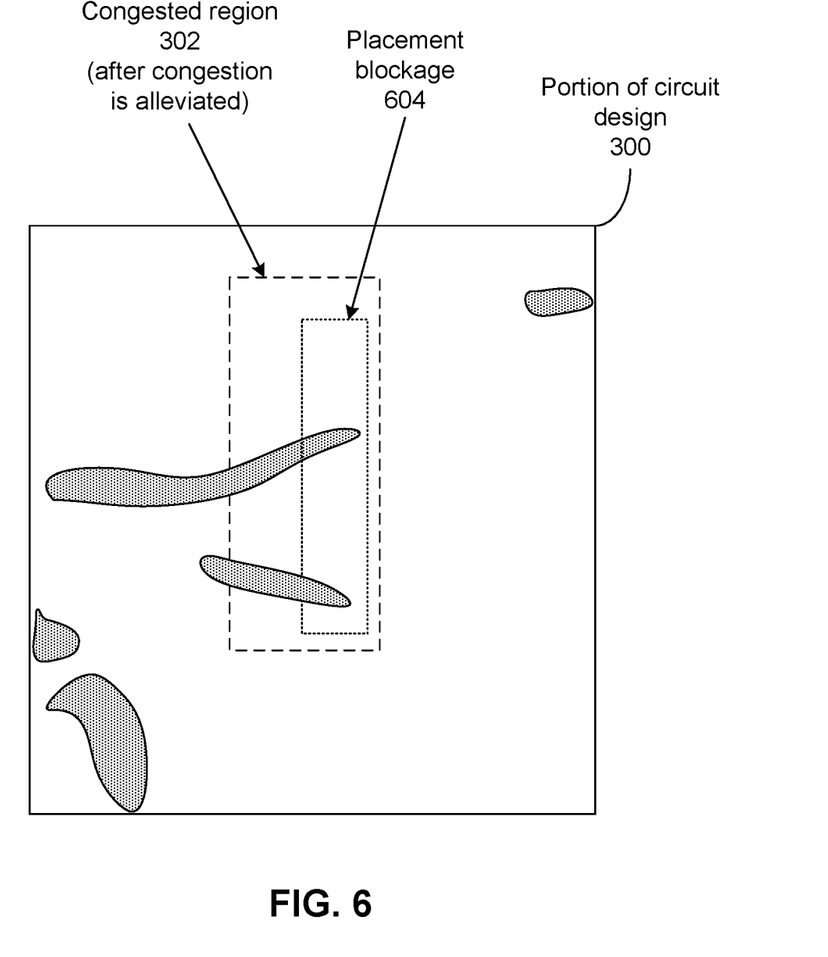
FIG. 6 illustrates a visual representation of congestion in the circuit design after congestion has been alleviated in accordance with some embodiments described in this disclosure.

FIG. 6 illustrates a visual representation of congestion in the circuit design after congestion has been alleviated in accordance with some embodiments described in this disclosure. The process illustrated in FIG. 5 may remove a set of buffer chains that pass through congested region 302 shown in FIG. 3, and reconstruct the set of buffer chains in the presence of placement blockage 604 shown in FIG. 6. The resulting congestion map is shown in FIG. 6. It is clear from FIG. 6 that congested region 302 is no longer congested, e.g., note that congested region 302 no longer has any darkly shaded regions. In general, the placement blockage can have the same shape and size, or have a different shape and/or size than the congested region. In FIG. 6, placement blockage 604 has a different size than congested region 302.

Process for Alleviating Routing Congestion by Spreading Out Buffer Chains

Figure 7:
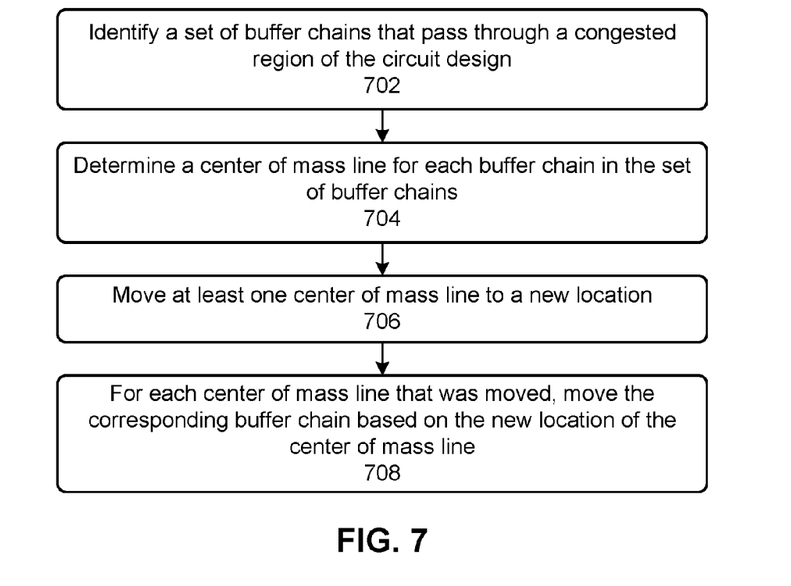
FIG. 7 illustrates a process for alleviating routing congestion by spreading out buffer chains in accordance with some embodiments described in this disclosure.

FIG. 7 illustrates a process for alleviating routing congestion by spreading out buffer chains in accordance with some embodiments described in this disclosure. The process can begin with identifying a set of buffer chains that pass through a congested region of a circuit design (operation 702). Next, the process can determine a center of mass line for each buffer chain in the set of buffer chains (operation 704). For horizontal buffer chains the process can determine the center of mass line by computing an average Y-coordinate of the buffer locations, and creating a horizontal line that passes through the average Y-coordinate. Likewise, for vertical buffer chains the process can determine the center of mass line by computing an average X-coordinate of the buffer locations, and creating a vertical line that passes through the average X-coordinate.

The process can then move at least one center of mass line to a new location (operation 706). For example, the process may evenly space out the center of mass lines in the region where the buffer chains are to be routed. Next, for each center of mass line that was moved, the process can move the corresponding buffer chain based on the new location of the center of mass line (operation 708).

In some embodiments, the process can also determine a relative position of each buffer in each buffer chain with respect to the corresponding center of mass line. For example, suppose the Y-coordinate of a buffer B in a buffer chain is y and the average Y-coordinate over all buffers in the buffer chain is $\bar{y}$, then the process can store the difference $(y-\bar{y})$ to keep track of the relative position of the buffer B with respect to the center of mass line. The relative position information may be used in operation 708 when the buffer chain is moved based on the new location of the center of mass line. Specifically, in some embodiments, operation 708 can involve moving each buffer in the buffer chain to a location that preserves the relative position of the buffer with respect to the center of mass line.

Figure 8A:
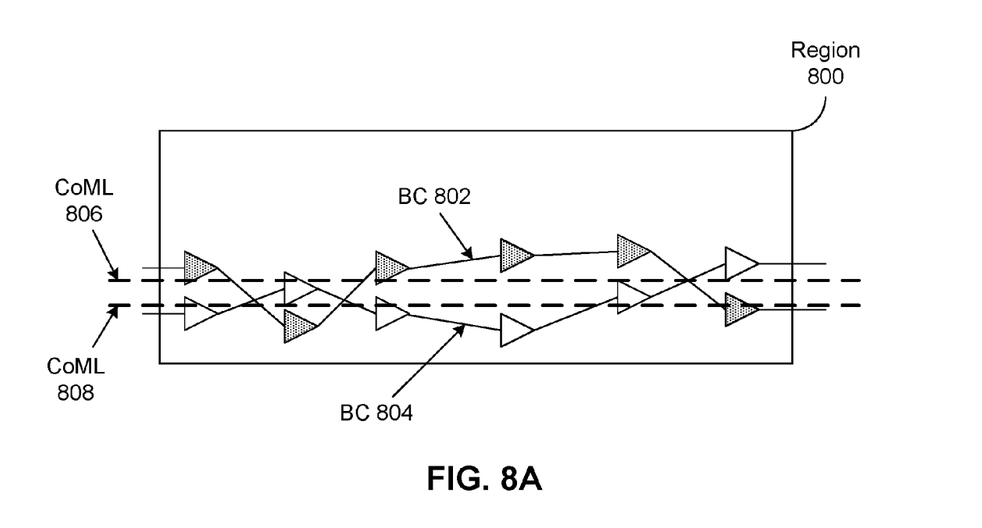
FIG. 8A illustrates how a center of mass line can be determined for buffer chains in accordance with some embodiments described in this disclosure.

FIG. 8A illustrates how a center of mass line can be determined for buffer chains in accordance with some embodiments described in this disclosure. Buffer chains 802 (shaded buffers in FIG. 8A) and 804 (clear buffers in FIG. 8A) pass through region 800 in a circuit design. Center of mass lines 806 and 808 (i.e., for buffer chains 802 and 804, respectively) can be determined by computing the average Y-coordinates of the buffers in the respective buffer chains, and by creating a line that passes through the average Y-coordinate.

Figure 8B:
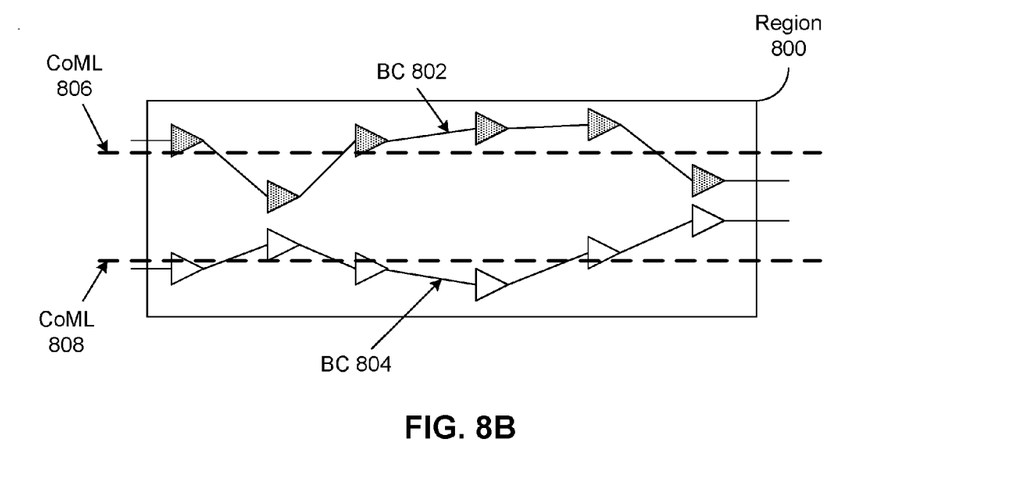
FIG. 8B illustrates how center of mass lines can be used to spread out buffer chains in accordance with some embodiments described in this disclosure.

FIG. 8B illustrates how center of mass lines can be used to spread out buffer chains in accordance with some embodiments described in this disclosure. Center of mass lines 806 and 808 have been spread out in region 800, and the corresponding buffer chains 802 and 804 have been moved based on the new locations of the center of mass lines. Specifically, in FIG. 8B, the buffer chains have been moved so that the relative positions between the center of mass line and the buffers are preserved.

Figure 9A:
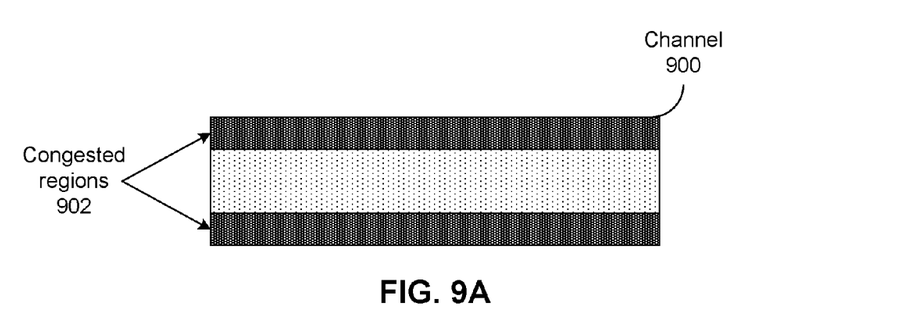
FIGS. 9A-9B illustrate how congestion can be alleviated by spreading out buffer chains in accordance with some embodiments described in this disclosure.
Figure 9B:
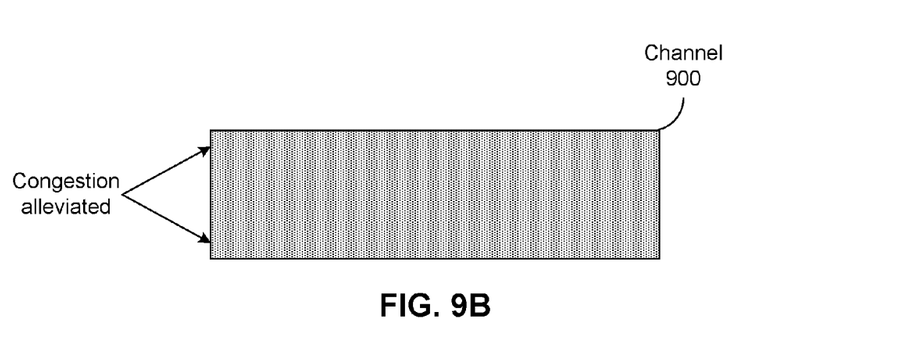

FIGS. 9A-9B illustrate how congestion can be alleviated by spreading out buffer chains in accordance with some embodiments described in this disclosure. FIG. 9A illustrates congested regions 902 in channel 900 (i.e., a long rectangular region of the circuit design where buffer chains can be placed) of a circuit design. FIG. 9B illustrates congestion in channel 900 after buffer chains are spread out using the process illustrated in FIG. 7. Note that congestion has been alleviated in the congested regions 902. The process illustrated in FIG. 7 is computationally very efficient and can alleviate congestion very quickly even in large circuit designs. For example, in some large circuit designs, the process illustrated in FIG. 7 was able to alleviate congestion by spreading out 10,000 buffer chains in approximately 2 minutes.

Computer System

Figure 10:
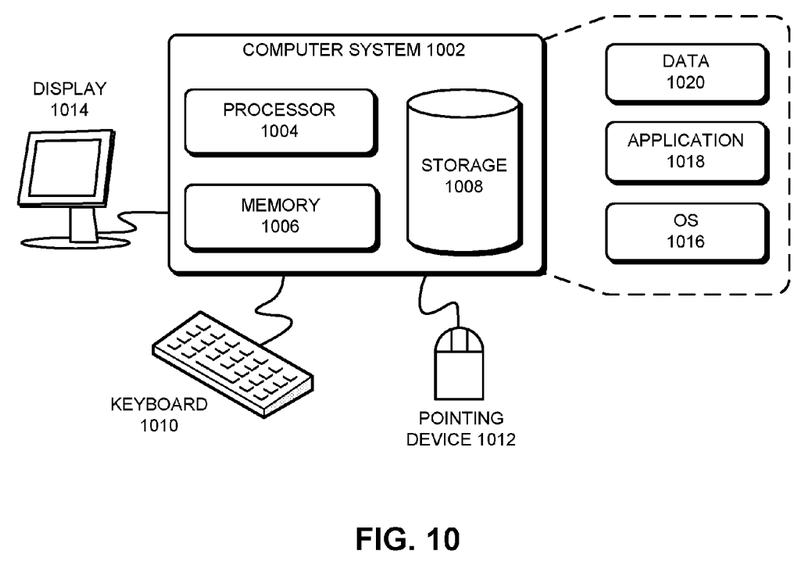
FIG. 10 illustrates a computer system in accordance with some embodiments described in this disclosure.

FIG. 10 illustrates a computer system in accordance with some embodiments described in this disclosure. Computer system 1002 can include processor 1004, memory 1006, and storage device 1008. Computer system 1002 can be coupled to display device 1014, keyboard 1010, and pointing device 1012. Storage device 1008 can store operating system 1016, application 1018, and data 1020. Data 1020 can include input required by application 1018 and/or output generated by application 1018.

Computer system 1002 may automatically (or with user intervention) perform one or more operations that are implicitly or explicitly described in this disclosure. For example, computer system 1002 can load application 1018 into memory 1006, and application 1018 can then be used to identify buffer chains that pass through a region of a circuit design and/or to alleviate congestion in the circuit design.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer system, cause the computer system to perform a method for alleviating congestion in a circuit design, the method comprising:
    upon receipt of the circuit design, identifying a set of buffer chains that pass through a congested region of the circuit design;
    determining a center of mass line for each buffer chain in the set of buffer chains;
    moving at least one center of mass line to a new location; and
    for each center of mass line that was moved, moving a corresponding buffer chain based on the new location of the center of mass line.

2. The non-transitory computer-readable storage medium of claim 1, wherein the method further comprises:
    for each buffer chain, determining a relative position of each buffer in the buffer chain with respect to a center of mass line corresponding to the buffer chain.

3. The non-transitory computer-readable storage medium of claim 2, wherein for each center of mass line that was moved, said moving the corresponding buffer chain based on the new location of the center of mass line comprises:
    moving each buffer in the buffer chain to a location that preserves the relative position of the buffer with respect to the center of mass line.

4. The non-transitory computer-readable storage medium of claim 1, wherein a buffer chain passes through the congested region if all sources and sinks of the buffer chain are located outside the congested region.

5. The non-transitory computer-readable storage medium of claim 1, wherein the set of buffer chains does not include buffer chains whose placement has been fixed by a user.

6. The non-transitory computer-readable storage medium of claim 1, wherein the set of buffer chains does not include buffer chains whose timing slack is less than a threshold timing slack value.

7. The non-transitory computer-readable storage medium of claim 1 further storing instructions for a graphical user interface (GUI) to display a visual representation of congestion in the circuit design.

8. A method performed by an electronic design automation (EDA) tool in a computer system for alleviating congestion in a circuit design, the method comprising:
    the EDA tool displaying a visual representation of congestion in the circuit design using a graphical user interface (GUI) of the EDA tool;
    the EDA tool identifying a set of buffer chains that pass through a congested region of the circuit design;
    the EDA tool determining a center of mass line for each buffer chain in the set of buffer chains;
    the EDA tool moving at least one center of mass line to a new location;
    for each center of mass line that was moved, the EDA tool moving a corresponding buffer chain based on the new location of the center of mass line; and
    the EDA tool displaying an updated visual representation of congestion in the circuit design using the GUI of the EDA tool.

9. The method of claim 8, further comprising:
    for each buffer chain, the EDA tool determining a relative position of each buffer in the buffer chain with respect to a center of mass line corresponding to the buffer chain.

10. The method of claim 9, wherein for each center of mass line that was moved, said moving the corresponding buffer chain based on the new location of the center of mass line comprises:
    the EDA tool moving each buffer in the buffer chain to a location that preserves the relative position of the buffer with respect to the center of mass line.

11. The method of claim 8, wherein a buffer chain passes through the congested region if all sources and sinks of the buffer chain are located outside the congested region.

12. The method of claim 8, wherein the set of buffer chains does not include buffer chains whose placement has been fixed by a user.

13. The method of claim 8, wherein the set of buffer chains does not include buffer chains whose timing slack is less than a threshold timing slack value.

14. The method of claim 8, wherein prior to the EDA tool identifying the set of buffer chains that pass through the congested region of the circuit design, the method further comprising:
    the EDA tool receiving, via the GUI, a user-selected contour of the congested region.

15. A computer system, comprising:
    a processor;
    a graphical user interface (GUI) capable of displaying a visual representation of congestion in a circuit design before and after performing a method for alleviating congestion in the circuit design; and a non-transitory computer-readable storage medium storing instructions that, when executed by the processor, cause the computer system to perform the method for alleviating congestion in the circuit design, the method comprising:

identifying a set of buffer chains that pass through a congested region of the circuit design;

determining a center of mass line for each buffer chain in the set of buffer chains;

moving at least one center of mass line to a new location; and for each center of mass line that was moved, moving a corresponding buffer chain based on the new location of the center of mass line, thereby improving the circuit design by alleviating congestion in the circuit design.

16. The computer system of claim 15, wherein the method further comprises:

for each buffer chain, determining a relative position of each buffer in the buffer chain with respect to a center of mass line corresponding to the buffer chain; and wherein for each center of mass line that was moved, said moving the corresponding buffer chain based on the new location of the center of mass line comprises moving each buffer in the buffer chain to a location that preserves the relative position of the buffer with respect to the center of mass line.

17. The computer system of claim 15, wherein a buffer chain passes through the congested region if all sources and sinks of the buffer chain are located outside the congested region.

18. The computer system of claim 15, wherein the set of buffer chains does not include buffer chains whose placement has been fixed by a user.

19. The computer system of claim 15, wherein the set of buffer chains does not include buffer chains whose timing slack is less than a threshold timing slack value.

20. The computer system of claim 15, wherein prior to identifying the set of buffer chains that pass through the congested region of the circuit design, the method comprises receiving, via the GUI, a user-selected contour of the congested region.

* * * * *